United States Patent
Shimokawa et al.

(10) Patent No.: US 9,373,735 B2
(45) Date of Patent: Jun. 21, 2016

(54) POLYIMIDE-METAL LAMINATE AND SOLAR CELL

(75) Inventors: Hiroto Shimokawa, Ube (JP); Takeshi Uekido, Ube (JP); Naoyuki Matsumoto, Ube (JP); Ken Kawagishi, Ube (JP); Hiroaki Yamaguchi, Ube (JP)

(73) Assignee: UBE INDUSTRIES, LTD. (JP)

( * ) Notice: Subject to any disclaimer, the term of this patent is extended or adjusted under 35 U.S.C. 154(b) by 249 days.

(21) Appl. No.: 12/993,951

(22) PCT Filed: May 20, 2009

(86) PCT No.: PCT/JP2009/059283
§ 371 (c)(1),
(2), (4) Date: Nov. 22, 2010

(87) PCT Pub. No.: WO2009/142244
PCT Pub. Date: Nov. 26, 2009

(65) Prior Publication Data
US 2011/0079277 A1    Apr. 7, 2011

(30) Foreign Application Priority Data

May 20, 2008 (JP) ................................. 2008-132570
May 20, 2008 (JP) ................................. 2008-132571

(51) Int. Cl.
*H01L 31/032* (2006.01)
*H01L 31/0392* (2006.01)
*B29C 41/24* (2006.01)
*B29K 79/00* (2006.01)

(52) U.S. Cl.
CPC ...... *H01L 31/0322* (2013.01); *H01L 31/03928* (2013.01); *B29C 41/24* (2013.01); *B29K 2079/08* (2013.01); *Y02E 10/541* (2013.01); *Y02P 70/521* (2015.11)

(58) Field of Classification Search
CPC .... B29K 2079/08; B29C 41/24; B29C 41/26; H01L 31/0322; H01L 31/03928; Y02E 10/541; Y02P 70/521
See application file for complete search history.

(56) References Cited

U.S. PATENT DOCUMENTS 6,274,805 B1    8/2001  Nakazawa et al.
6,310,281 B1 *  10/2001 Wendt et al. .................. 136/256
6,974,976 B2 *  12/2005 Hollars ......................... 257/184

2002/0058149 A1    5/2002  Yamamoto et al.
2009/0197068 A1 *  8/2009 Yamaguchi et al. .......... 428/220
2009/0297837 A1   12/2009 Iwai et al.

FOREIGN PATENT DOCUMENTS

| JP | A-H10-041237 | 2/1998 |
|---|---|---|
| JP | A-H11-029645 | 2/1999 |
| JP | A-2001-156313 | 6/2001 |
| JP | A-2003-179238 | 6/2003 |
| JP | A-2007-016100 | 1/2007 |
| JP | A-2007-201069 | 8/2007 |
| JP | A-2007-317834 | 12/2007 |
| JP | A-2008-098344 | 4/2008 |
| TW | 474956 | 2/2002 |
| WO | WO 98/50962 A1 | 11/1998 |
| WO | WO 2006/047207 A2 | 5/2006 |

OTHER PUBLICATIONS

Sheng-Huei Hsiao, Yu-Jen Chen, Structure—property study of polyimides derived from PMDA and BPDA dianhydrides with structurally different diamines, European Polymer Journal, vol. 38, Issue 4, Apr. 2002, pp. 815-828, ISSN 0014-3057, 10.1016/S0014-3057(01)00229-4. (http://www.sciencedirect.com/science/article/pii/S0014305701002294).*
International Search report issued in corresponding PCT Application No. PCT/JP2009/059283 mailed Aug. 25, 2009.
International Preliminary Report on Patentability and Written Opinion corresponding to PCT Application No. PCT/JP2009/059283, mailed Jan. 20, 2011.
Office Action issued in corresponding Chinese Patent Application No. 200980127146.X on Aug. 2, 2012.
Kessler et al., "Technological aspects of flexible CIGS solar cells and modules", Solar Energy vol. 77, pp. 685-695, 2004.
Tiwari et al., "12.8% Efficiency Cu (In, Ga) Se$_2$ Solar Cell on a Flexible Polymer Sheet", Progress in Photovoltaics: Research and Applications, vol. 7, pp. 393-397, 1999.
Extended Search Report, dated Feb. 6, 2013, for European Patent Application No. 09750606.7.
Office Action issued on Jun. 4, 2013 in Japanese Patent Application No. 2009-122267.
Office Action issued on Jun. 18, 2013 in Japanese Patent Application No. 2009-122292.
Office Action issued on Dec. 10, 2013 in Taiwanese Patent Application No. 098116764.

* cited by examiner

*Primary Examiner* — Callie Shosho
*Assistant Examiner* — John Freeman
(74) *Attorney, Agent, or Firm* — Knobbe Martens Olson & Bear LLP (57) ABSTRACT

A polyimide-metal laminate comprising a polyimide film and a metal layer for use as an electrode, which is formed on the side (Side B) of the polyimide film which was in contact with a support when producing a self-supporting film in the production of the polyimide film, is used to produce a CIS solar cell.

7 Claims, 1 Drawing Sheet

POLYIMIDE-METAL LAMINATE AND SOLAR CELL

This application is the U.S. National Phase under 35 U.S.C. §371 of International Application PCT/JP2009/059283, filed May 20, 2009, designating the U.S., and published in Japanese as WO2009/142244 on Nov. 26, 2009, which claims priority to Japanese Patent Application No. 2008-132570, filed May 20, 2008; and to Japanese Patent Application No. 2008-132571, filed May 20, 2008, the entire contents of which are incorporated herein by reference.

TECHNICAL FIELD

The present invention relates to a polyimide-metal laminate for use in the production of a CIS solar cell. The present invention also relates to a CIS solar cell comprising the laminate and having high conversion efficiency.

BACKGROUND ART

In recent years, a solar cell (CIS solar cell) comprising a chalcopyrite semiconductor layer such as a layer of $CuInSe_2$ and a solid solution of Ga in $CuInSe_2$, i.e. $Cu(In,Ga)Se_2$ attracts considerable attention as a solar cell having high photoelectric conversion efficiency. A CIS solar cell generally comprises a substrate, a back electrode layer, a chalcopyrite semiconductor layer as a light absorbing layer, a buffer layer, a transparent electrode layer, and an extraction electrode in that order.

Conventionally, glass (soda-lime glass) is used as a substrate for a CIS solar cell, and molybdenum (Mo) is used as a back electrode formed thereon. In addition, a CIS solar cell comprising a flexible film as a substrate has been proposed (See Patent Document 1, for example). As compared with a conventional solar cell comprising a glass substrate, a solar cell comprising a flexible substrate is expected to find widespread application in view of its flexibility and light-weight. Another advantage of a flexible substrate is that a solar cell may be produced in a roll-to-roll process, which is suitable for mass production.

However, a CIS solar cell comprising a flexible substrate such as a polyimide substrate is apt to have lower conversion efficiency than a CIS solar cell comprising a glass substrate. This is because even a polyimide, which is known as a heat-resistant resin, may withstand a temperature of about 450° C. at the highest and may not be heated at a temperature equal to or higher than 450° C., while a heat treatment at a temperature equal to or higher than 450° C., preferably at a temperature equal to or higher than 500° C., is required for the formation of a high-quality CIS semiconductor thin film having low defect density.

Patent Document 2 discloses a process for producing a CIS solar cell comprising a polyimide substrate and having high conversion efficiency, which comprises steps of:

forming an electrode film on a polyimide substrate;

forming a thin film containing Cu, and In and/or Ga, and Se and/or S on or over the electrode film (in other words, directly or indirectly on the electrode film); and rapidly heating the thin film to a temperature equal to or higher than 450° C., preferably from 500° C. to 600° C., and maintaining the thin film at the temperature for 10 sec to 300 sec, thereby forming a chalcopyrite semiconductor film.

Patent Document 2 also discloses a process for producing a CIS solar cell, which comprises steps of:

forming an electrode film on a polyimide substrate;

forming a thin film containing Cu, and In and/or Ga on or over the electrode film; and rapidly heating the thin film to a temperature equal to or higher than 450° C., preferably from 500° C. to 600° C., and maintaining the thin film at the temperature for 10 sec to 300 sec in an atmosphere containing Se and/or S, thereby forming a chalcopyrite semiconductor film.

In these processes, the step of forming a thin film which is a precursor of a semiconductor film and the step of heating the precursor thin film are separately performed, rapid heating is performed in the step of heating the precursor thin film for crystal growth, and therefore a heat treatment at a temperature equal to or higher than 500° C. is performed in a shorter period of time so that a chalcopyrite semiconductor thin film suitable for a light absorbing layer of a solar cell may be prepared. In these processes, however, a heat treatment at a high temperature is still required, even though the heat treatment is performed in a short period of time; therefore the curling of the polyimide substrate and cracks in the electrode film and/or the semiconductor film may occur.

Patent Document 3 discloses a solar cell comprising a substrate film, and a laminate comprising at least an electrode layer and a chalcopyrite semiconductor thin film which is formed on the substrate film, wherein the substrate film is a polyimide film prepared by the polycondensation of an aromatic diamine and an aromatic tetracarboxylic dianhydride, which has a thickness within a range of from 3 μm to 200 μm, an average coefficient of thermal expansion up to 300° C. within a range of from 1 ppm/° C. to 10 ppm/° C., and a tensile strength at break in the length direction of 300 MPa or higher. Patent Document 3 also discloses that a preferable substrate film is a polyimide-benzoxazole film prepared by the polycondensation of an aromatic diamine having a benzoxazole structure and an aromatic tetracarboxylic dianhydride. In Example 8, a CIS solar cell comprising a polyimide film as a substrate, which is prepared from 3,3',4,4'-biphenyltetracarboxylic dianhydride and p-phenylenediamine by thermal imidization, is disclosed. However, although the dimensional change of the polyimide film up to 300° C. in a temperature-increasing step is taken into consideration, the dimensional change at elevated temperatures (up to 500° C. or higher) and in a temperature-decreasing step is not taken into consideration. The CIS solar cell disclosed in Patent Document 3 may not have adequate properties.

CITATION LIST

Patent Document

Patent Document 1: WO 98/50962 A1
Patent Document 2: JP-A-2003-179238
Patent Document 3: JP-A-2007-317834

SUMMARY OF INVENTION

Problems to be Solved by the Invention

An object of the present invention is to provide a polyimide-metal laminate for realizing a flexible CIS solar cell having high conversion efficiency; specifically a polyimide-metal laminate having extremely high heat resistance, which is capable of withstanding a heat treatment at a temperature equal to or higher than 500° C.

Means for Solving the Problems

The present invention relates to the following items.

[1] A polyimide-metal laminate for use in the production of a CIS solar cell comprising a chalcopyrite semiconductor layer; comprising a polyimide film and a metal layer for use as an electrode, which is formed on or over the polyimide film; wherein the polyimide film is produced by imidizing a self-supporting film, which is prepared by flow-casting a solution of a polyimide precursor prepared from an aromatic tetracarboxylic acid component and an aromatic diamine component on a support, followed by heating; and the metal layer for use as an electrode is formed on the side (Side B) of the polyimide film which was in contact with the support when producing the self-supporting film.

[2] The laminate according to the above [1], wherein the polyimide film is prepared from an aromatic tetracarboxylic acid component comprising 3,3',4,4'-biphenyltetracarboxylic dianhydride as a main component and an aromatic diamine component comprising p-phenylenediamine as a main component.

[3] The laminate according to any one of the above [1] to [2], wherein the metal layer for use as an electrode comprises molybdenum.

[4] The laminate according to any one of the above [1] to [3], wherein the metal layer for use as an electrode is formed by sputtering or vapor deposition.

[5] The laminate according to any one of the above [1] to [4], further comprising a metal layer for use as a protective layer, which is formed on the opposite side (Side A) of the polyimide film to Side B.

[6] The laminate according to the above [5], wherein the metal layer for use as an electrode is formed before forming the metal layer for use as a protective layer.

[7] The laminate according to any one of the above [5] to [6], wherein the metal layer for use as a protective layer comprises molybdenum.

[8] The laminate according to any one of the above [5] to [7], wherein the metal layer for use as a protective layer is formed by sputtering or vapor deposition.

[9] A CIS solar cell comprising a laminate according to any one of the above [1] to [8].

[10] A process for producing a CIS solar cell comprising a laminate according to any one of the above [1] to [8], comprising a step of:

forming a chalcopyrite semiconductor layer on the metal layer, which is formed on Side B of the polyimide film in the laminate.

[11] A polyimide-metal laminate for use in the production of a CIS solar cell comprising a chalcopyrite semiconductor layer; comprising a polyimide film and a metal layer for use as an electrode, which is formed on or over the polyimide film; wherein a metal layer for use as a protective layer is formed on the opposite side of the polyimide film to the metal layer for use as an electrode; and the metal layer for use as an electrode is formed before forming the metal layer for use as a protective layer.

[12] A CIS solar cell comprising a laminate according to the above [11].

[13] A process for producing a CIS solar cell comprising a laminate according to the above [11], comprising a step of:

forming a chalcopyrite semiconductor layer on the metal layer, which is formed on the polyimide film in the laminate earlier than the other metal layer.

Effect of the Invention

As described above, a laminate in which a metal layer for use as an electrode and a chalcopyrite semiconductor layer (or a thin precursor film thereof) are formed on a substrate should be heated at a temperature equal to or higher than 500° C. for a period of 10 sec or longer for the formation of a high-quality chalcopyrite semiconductor layer and, in turn, the production of a CIS solar cell having high conversion efficiency. Accordingly, a polyimide film capable of withstanding a heat treatment at such a high temperature should be used as a substrate for a CIS solar cell. In addition, a laminate in which a metal layer for use as an electrode is formed on the polyimide film should be capable of withstanding a heat treatment at such a high temperature.

A laminate comprising a metal layer for use as an electrode formed on the side (Side B) of a polyimide film which was in contact with a support when producing a self-supporting film thereof may have fewer cracks in the metal layer caused by a heat treatment at a temperature equal to or higher than 500° C., as compared with a laminate comprising the same metal layer formed on the opposite side (Side A) of the same polyimide film to Side B. Accordingly, a high-quality CIS solar cell having high conversion efficiency may be produced while preventing cracks in a metal layer to be used as an electrode and a semiconductor layer, and delamination of these layers from a substrate, when the metal layer to be used as an electrode is formed on Side B of the polyimide film, in other words, when a metal layer formed on Side B of the polyimide film is used as an electrode, and a chalcopyrite semiconductor layer, a transparent electrode, etc. are formed on the metal layer to prepare a CIS solar cell.

Although the reasons why a metal layer formed on Side B of the polyimide film has fewer cracks remains unclear, one of the reasons may be the difference in brittleness of the polyimide film surface. A self-supporting film of a polyimide precursor solution is prepared as a first step for the production of a polyimide film. The self-supporting film may be prepared by flow-casting a solution of a polyimide precursor in an organic solvent to give a polyimide on a support such as a stainless belt, and then heating it sufficiently to make it self-supporting (solvent removal+partial imidization). When producing the self-supporting film, Side B of the film is in contact with the support, and therefore substantially no solvent volatilizes from Side B, whereas Side A of the film is open to atmosphere, and therefore a large amount of solvent volatilizes from Side A when heated. A polyimide film is produced by heating a solution of a polyimide precursor to convert the polyimide precursor into a polyimide by intramolecular cyclization. Once a solvent contained in a polyimide precursor solution volatilizes, the molecular mobility decreases, and the imidization reaction does not adequately proceed; therefore the molecular weight of the polyimide obtained does not adequately increase, and the surface of the polyimide film obtained is brittler. For this reason, Side B from which less solvent volatilizes may have a harder surface, which is capable of withstanding a heat treatment at a temperature equal to or higher than 500° C., as compared with Side A from which more solvent volatilizes.

Such a difference in occurrence of defects including cracks in a metal layer may arise between Side A and Side B of the polyimide film only in a high-temperature heat treatment such as a heat treatment for the production of a CIS solar cell, and may not generally arise in a low-temperature heat treatment. In the case of low-temperature heat treatment, such a problem may not arise even when a metal layer formed on Side A of a polyimide film is employed.

Furthermore, in the case of a laminate which comprises metal layers formed on both sides of the polyimide film, an earlier-formed metal layer may have fewer cracks caused by a heat treatment at a temperature equal to or higher than 500° C., as compared with a later-formed metal layer. Accordingly, a high-quality CIS solar cell having high conversion efficiency may be produced while preventing cracks in an electrode layer and a semiconductor layer, and delamination of these layers from a substrate, when an earlier-formed metal layer is used as an electrode, and a chalcopyrite semiconductor layer, a transparent electrode, etc. are formed on the metal layer to prepare a CIS solar cell, as compared with when a later-formed metal layer is used as an electrode.

Although the reasons why a metal layer which is formed earlier than the other metal layer, i.e. an earlier-formed metal layer, has fewer cracks remains unclear, one of the reasons may be an influence of a decomposition product/volatile component during the formation of the metal layer. A metal layer may be formed by sputtering or vapor deposition. When forming a metal layer by sputtering or vapor deposition, a great amount of energy is applied to a polyimide film surface, and therefore a residual solvent contained in the polyimide film may volatilize, and/or a part of polyimide may decompose and volatilize. When forming an earlier-formed metal layer, such a volatile component diffuse throughout the polyimide film and volatilizes from the opposite surface to the earlier-formed metal layer. On the other hand, when forming a later-formed metal layer, a volatile component is concentrated at the surface on which the metal layer is formed due to the barrier effect of the earlier-formed metal layer, which results in the occurrence of many defects in the later-formed metal layer. Due to the defects, the quality of the metal layer may be reduced and flaws including cracks may occur.

Such a difference in occurrence of defects including cracks in a metal layer may arise between an earlier-formed metal layer and a later-formed metal layer only in a high-temperature heat treatment such as a heat treatment for the production of a CIS solar cell, and may not generally arise in a low-temperature heat treatment. In the case of low-temperature heat treatment, such a problem may not arise even when a later-formed metal layer is employed.

DESCRIPTION OF EMBODIMENTS

As described above, a heat treatment at a temperature equal to or higher than 500° C. is required for the production of a CIS solar cell having high conversion efficiency. Accordingly, a polyimide film capable of withstanding a heat treatment at such a high temperature should be used as a substrate for a CIS solar cell.

The polyimide film used in the present invention may preferably have the maximum value and the minimum value of the dimensional change from 25° C. to 500° C., preferably in the directions of both MD and TD, within a range of from −0.3% to +0.6%, more preferably from −0.2% to +0.6%, particularly preferably from 0% to +0.6%, based on the initial dimension at 25° C.

The term "dimensional change from 25° C. to 500° C." as used herein refers to a maximum value and a minimum value of the percentage of dimensional change of a polyimide film of interest relative to the initial value (dimension at 25° C. before heat treatment) both in the MD direction (in the continuous film-forming direction (machine direction); in the length direction) and in the TD direction (in the direction perpendicular to the MD direction; in the width direction) at each temperature in the temperature-increasing step of from 25° C. to 500° C. and the subsequent temperature-decreasing step of from 500° C. to 25° C., which is measured by a thermo-mechanical analyzer (TMA) under the following conditions.

Measurement mode: Tensile mode, load: 2 g,
Sample length: 15 mm,
Sample width: 4 mm,
Temperature-increasing start temperature: 25° C.,
Temperature-increasing end temperature: 500° C.
(No holding time at 500° C.),
Temperature-decreasing end temperature: 25° C., Temperature-increasing and -decreasing rate: 20° C./min,
Measurement atmosphere: Nitrogen.

Accordingly, the term "the dimensional change from 25° C. to 500° C. is within a range of from −0.3% to +0.6%" means that the dimensional change in the directions of both MD and TD is always within a range of from −0.3% to +0.6% in the temperature-increasing step of from 25° C. to 500° C. and the subsequent temperature-decreasing step of from 500° C. to 25° C.

The dimensional change is defined by the following formula (1).

Herein, the maximum value (%) of the dimensional change may be calculated from the formula (1) in which L is the maximum dimension in the temperature-increasing step and the subsequent temperature-decreasing step. The minimum value (%) of the dimensional change may be calculated from the formula (1) in which L is the minimum dimension in the temperature-decreasing step.

$$\text{Dimensional change (\%)} = (L - L_0)/L_0 \times 100 \tag{1}$$

wherein L represents the length at a measurement temperature, and $L_0$ represents the length at 25° C. before heat treatment.

A high-quality CIS solar cell having high conversion efficiency may be produced while preventing cracks in a metal layer to be used as an electrode and a semiconductor layer, and delamination of these layers from a substrate, when using a polyimide film as a substrate which has a dimensional change in the directions of both MD and TD within a range of from −0.3% to +0.6% based on the initial dimension at 25° C. (before heat treatment) in the temperature-increasing step of from 25° C. to 500° C. and the subsequent temperature-decreasing step.

A polyimide film to be used as a substrate may preferably have a weight loss after heat treatment at 500° C. for 20 min within a range of from 0 wt % to 1 wt %, more preferably from 0 wt % to 0.5 wt %, in view of heat resistance.

The weight loss after heat treatment at 500° C. for 20 min is calculated from the following formula (2). For the determination, a polyimide film of interest is heated from room temperature to 500° C. at a rate of 50° C./min, and the weight of the polyimide film is measured immediately after reaching 500° C., and the weight is measured again after maintaining the film at 500° C. for 20 min.

$$\text{Weight loss (\%)} = (W_0 - W)/W_0 \times 100 \tag{2}$$

wherein $W_0$ represents the weight immediately after reaching 500° C., and W represents the weight after maintaining the film at 500° C. for 20 min.

A volatile component such as water and a residual solvent volatilizes before reaching 500° C. Accordingly, the weight loss is an index of the decomposition/thermal degradation of the polyimide. A greater weight loss indicates a greater degradation.

Such a polyimide film having high dimensional stability during a heat treatment at a temperature equal to or higher than 500° C. may be prepared by heating a polyimide film, which is prepared by the polymerization of an aromatic tetracarboxylic acid component and an aromatic diamine component, at a temperature of 500° C. or higher, preferably at a temperature of from 500° C. to 550° C., more preferably from 500° C. to 540° C., further preferably from 500° C. to 530° C., particularly preferably from 500° C. to 520° C., preferably for 30 sec to 10 min, more preferably for 1 min to 5 min, in a substantially unstressed state.

There are no particular restrictions to the polyimide film to be heated, so long as it has high heat resistance and does not or very little decompose/degrade when heated at a temperature equal to or higher than 500° C. The polyimide film may be a polyimide film prepared from an aromatic tetracarboxylic acid component comprising 3,3',4,4'-biphenyltetracarboxylic dianhydride as a main component and an aromatic diamine component comprising p-phenylenediamine as a main component, for example.

When a coefficient of thermal expansion of a substrate is substantially different from those of a metal layer to be used as an electrode (in general, Mo layer or W layer) and a chalcopyrite semiconductor layer, cracks in a metal layer for use as an electrode and a semiconductor layer, and delamination of a metal layer for use as an electrode and a semiconductor layer from a substrate may occur. Accordingly, a polyimide film to be used as a substrate for a CIS solar cell may preferably have a coefficient of thermal expansion in the directions of both MD and TD from 25° C. to 500° C. within a range of from 1 ppm/° C. to 10 ppm/° C.

The term "coefficient of thermal expansion from 25° C. to 500° C." as used herein is an average coefficient of thermal expansion, which is calculated by the following formula (3) from the dimensional change in the directions of MD and TD in the temperature-increasing step for the determination of dimensional change from 25° C. to 500° C. as described above.

$$\text{Coefficient of thermal expansion (ppm/° C.)} = (L-L_0)/\{L_0 \times (T-T_0)\} \times 10^6 \quad (3)$$

wherein L represents the length at 500° C., $L_0$ represents the length at 25° C. before heat treatment, T represents 500° C., and $T_0$ represents 25° C.

A polyimide which has a coefficient of thermal expansion within the above-mentioned range and high heat resistance, and does not or very little decompose/degrade when heated at a temperature equal to or higher than 500° C. may be prepared by chemical imidization from an aromatic tetracarboxylic acid component comprising 3,3',4,4'-biphenyltetracarboxylic dianhydride as a main component and an aromatic diamine component comprising p-phenylenediamine as a main component. A polyimide film which has a coefficient of thermal expansion within the above-mentioned range may be also prepared by thermally imidizing a self-supporting film, which is prepared from a solution of a polyimide precursor prepared from an aromatic tetracarboxylic acid component comprising 3,3',4,4'-biphenyltetracarboxylic dianhydride as a main component and an aromatic diamine component comprising p-phenylenediamine as a main component, after or while stretching the self-supporting film.

In the determination of the dimensional change and the weight loss as described above, all temperatures are measured on the surface of the polyimide film.

In addition, a polyimide film to be used as a substrate for a CIS solar cell may preferably have a tensile strength at break of 300 MPa or higher.

The polyimide film may be produced as follows. Firstly, a polyimide precursor (polyamic acid) is synthesized by reacting an aromatic tetracarboxylic acid component and an aromatic diamine component. And then, the solution of the polyimide precursor thus obtained is flow-cast on a support and heated, thereby preparing a self-supporting film of a polyimide precursor solution. Subsequently, the self-supporting film is imidized, thereby producing a polyimide film. The imidization for the production of the polyimide film may be either thermal imidization or chemical imidization.

For example, the polyimide film may be produced by thermal imidization as follows.

Firstly, a self-supporting film of a polyimide precursor solution is prepared. A self-supporting film of a polyimide precursor solution may be prepared by flow-casting a solution of a polyimide precursor in an organic solvent to give a polyimide on a support, after adding an imidization catalyst, an organic phosphorous compound and/or an inorganic fine particle to the solution, if necessary, and then heating it sufficiently to make it self-supporting, which means a stage before a common curing process.

A preferable polyimide precursor may be prepared from an aromatic tetracarboxylic dianhydride and an aromatic diamine.

Among others, preferred is a polyimide precursor prepared from an aromatic tetracarboxylic acid component comprising 3,3',4,4'-biphenyltetracarboxylic dianhydride (hereinafter, sometimes abbreviated as "s-BPDA") as a main component and an aromatic diamine component comprising p-phenylenediamine (hereinafter, sometimes abbreviated as "PPD") as a main component. Specifically, an aromatic tetracarboxylic acid component may preferably comprise 75 mol % or more, more preferably 80 mol % or more, particularly preferably 90 mol % or more, further preferably 95 mol % or more of s-BPDA. An aromatic diamine component may preferably comprise 75 mol % or more, more preferably 80 mol % or more, particularly preferably 90 mol % or more, further preferably 95 mol % or more of PPD.

In addition to s-BPDA and PPD, other tetracarboxylic acid component(s) and other diamine component(s) may be used, as long as the characteristics of the present invention would not be impaired.

Specific examples of the aromatic tetracarboxylic acid component to be used together with 3,3',4,4'-biphenyltetracarboxylic dianhydride in the present invention may include pyromellitic dianhydride, 2,3',3,4'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(2,3-dicarboxyphenyl) ether dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 2,2-bis(3,4-dicarboxyphenyl)-1,1,1,3,3,3-hexafluoropropane dianhydride, and 2,2-bis(2,3-dicarboxyphenyl)-1,1,1,3,3,3-hexafluoropropane dianhydride. Specific examples of the aromatic diamine component to be used together with p-phenylenediamine may include m-phenylenediamine, 2,4-diaminotoluene, 2,6-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 4,4'-diaminobenzophenone, 3,3'-diaminobenzophenone, 4,4'-bis(4-aminophenyl)sulfide, 4,4'-diaminodiphenyl sulfone, 4,4'-diaminobenzanilide, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, bis[4-(3-aminophenoxy)phenyl]sulfone, and 2,2-bis[4-(4-aminophenoxy)phenyl]hexafluoropropane. Among others, preferred is a diamine having one or two benzene rings.

A polyimide precursor may be synthesized by random-polymerizing or block-polymerizing substantially equimolar amounts of an aromatic tetracarboxylic dianhydride and an aromatic diamine in an organic solvent. Alternatively, two or more polyimide precursors in which either of these two components is excessive may be prepared, and subsequently, these polyimide precursor solutions may be combined and then mixed under reaction conditions. The polyimide precursor solution thus obtained may be used without any treatment, or alternatively, after removing or adding a solvent, if necessary, to prepare a self-supporting film.

Examples of an organic solvent for the polyimide precursor solution include N-methyl-2-pyrrolidone, N,N-dimethylformamide, N,N-dimethylacetamide and N,N-diethylacetamide. These organic solvents may be used alone or in combination of two or more.

The polyimide precursor solution may contain an imidization catalyst, an organic phosphorous-containing compound, an inorganic fine particle, and the like, if necessary.

Examples of the imidization catalyst include substituted or unsubstituted nitrogen-containing heterocyclic compounds, N-oxide compounds of the nitrogen-containing heterocyclic compounds, substituted or unsubstituted amino acid compounds, hydroxyl-containing aromatic hydrocarbon compounds, and aromatic heterocyclic compounds. Particularly preferable examples of the imidization catalyst include lower-alkyl imidazoles such as 1,2-dimethylimidazole, N-methylimidazole, N-benzyl-2-methylimidazole, 2-methylimidazole, 2-ethyl-4-methylimidazole and 5-methylbenzimidazole; benzimidazoles such as N-benzyl-2-methylimidazole; and substituted pyridines such as isoquinoline, 3,5-dimethylpyridine, 3,4-dimethylpyridine, 2,5-dimethylpyridine, 2,4-dimethylpyridine and 4-n-propylpyridine. The amount of the imidization catalyst to be used is preferably about 0.01 to 2 equivalents, particularly preferably about 0.02 to 1 equivalents relative to the amount of an amide acid unit in a polyamide acid. When the imidization catalyst is used, the polyimide film obtained may have improved properties, particularly extension and edge-cracking resistance.

Examples of the organic phosphorous-containing compound include phosphates such as monocaproyl phosphate, monooctyl phosphate, monolauryl phosphate, monomyristyl phosphate, monocetyl phosphate, monostearyl phosphate, triethyleneglycol monotridecyl ether monophosphate, tetraethyleneglycol monolauryl ether monophosphate, diethylene glycol monostearyl ether monophosphate, dicaproyl phosphate, dioctyl phosphate, dicapryl phosphate, dilauryl phosphate, dimyristyl phosphate, dicetyl phosphate, distearyl phosphate, tetraethyleneglycol mononeopentyl ether diphosphate, triethylene glycol monotridecyl ether diphosphate, tetraethyleneglycol monolauryl ether diphosphate, and diethyleneglycol monostearyl ether diphosphate; and amine salts of these phosphates. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine and triethanolamine.

Examples of the inorganic fine particle include particulate inorganic oxide powders such as titanium dioxide powder, silicon dioxide (silica) powder, magnesium oxide powder, aluminum oxide (alumina) powder and zinc oxide powder; particulate inorganic nitride powders such as silicon nitride powder and titanium nitride powder; inorganic carbide powders such as silicon carbide powder; and particulate inorganic salt powders such as calcium carbonate powder, calcium sulfate powder and barium sulfate powder. These inorganic fine particles may be used in combination of two or more. These inorganic fine particles may be homogeneously dispersed using the known means.

A self-supporting film of a polyimide precursor solution may be prepared by flow-casting and applying the above-mentioned solution of a polyimide precursor in an organic solvent, or a polyimide precursor solution composition which is prepared by adding an imidization catalyst, an organic phosphorous-containing compound, an inorganic fine particle, and the like to the above solution, on a support; and then heating it to the extent that the film becomes self-supporting, which means a stage before a common curing process, for example, to the extent that the film may be peeled from the support.

The content of the polyimide precursor in the polyimide precursor solution may be preferably about 10 wt % to about 30 wt %. The polyimide precursor solution may preferably have a polymer concentration of about 8 wt % to about 25 wt %.

In the preparation of a self-supporting film, the heating temperature and the heating time may be appropriately determined. For example, a film of a polyimide precursor solution, which is flow-casted on a support, is heated at 100 to 180° C. for about 3 to 60 min.

A substrate having a smooth surface may be suitably used as the support. A stainless substrate or a stainless belt may be used as the support, for example. An endless substrate such as an endless belt may be suitably used for continuous production.

It is preferred that a weight loss on heating of a self-supporting film is within a range of 20 wt % to 50 wt %, and it is further preferred that a weight loss on heating of a self-supporting film is within a range of 20 wt % to 50 wt % and an imidization rate of a self-supporting film is within a range of 8% to 55% for the reason that the self-supporting film has sufficient mechanical properties; a coupling agent solution may be more evenly and more easily applied to the surface of the self-supporting film; and no foaming, flaws, crazes, cracks and fissures are observed in the polyimide film obtained after imidizing.

The weight loss on heating of a self-supporting film as described above is calculated by the following formula from the weight of the self-supporting film (W1) and the weight of the film after curing (W2).

$$\text{Weight loss on heating (\% by weight)} = \{(W1-W2)/W1\} \times 100$$

The imidization rate of a self-supporting film as described above may be calculated based on the ratio of the vibration band peak area or height measured with an IR spectrometer (ATR) between the self-supporting film and a fully-cured product. The vibration band peak utilized in the procedure may be a symmetric stretching vibration band of an imide carbonyl group and a stretching vibration band of a benzene ring skeleton. The imidization rate may be also determined in accordance with the procedure described in Japanese Laid-open Patent Publication No. 1997-316199, using a Karl Fischer moisture meter.

According to the present invention, a solution containing a surface treatment agent such as a coupling agent and a chelating agent may be applied to one side or both sides of the self-supporting film thus obtained, if necessary.

Examples of the surface treatment agent include various surface treatment agents that improve adhesiveness or adherence, and include various coupling agents and chelating agents such as a silane-based coupling agent, a borane-based coupling agent, an aluminium-based coupling agent, an aluminium-based chelating agent, a titanate-based coupling agent, a iron-based coupling agent, and a copper-based coupling agent. When using a coupling agent such as a silane coupling agent as a surface treatment agent, the more remarkable effect may be achieved.

Examples of the silane-based coupling agent include epoxysilane-based coupling agents such as γ-glycidoxypropyl trimethoxy silane, γ-glycidoxypropyl diethoxy silane, and β-(3,4-epoxycyclohexyl)ethyl trimethoxy silane; vinylsilane-based coupling agents such as vinyl trichloro silane, vinyl tris(β-methoxy ethoxy) silane, vinyl triethoxy silane, and vinyl trimethoxy silane; acrylsilane-based coupling agents such as γ-methacryloxypropyl trimethoxy silane; aminosilane-based coupling agents such as N-β-(aminoethyl)-γ-aminopropyl trimethoxy silane, N-β-(aminoethyl)-γ-aminopropylmethyl dimethoxy silane, γ-aminopropyl triethoxy silane, and N-phenyl-γ-aminopropyl trimethoxy silane; γ-mercaptopropyl trimethoxy silane, and γ-chloropropyl trimethoxy silane. Examples of the titanate-based coupling agent include isopropyl triisostearoyl titanate, isopropyl tridecyl benzenesulfonyl titanate, isopropyl tris(dioctyl pyrophosphate) titanate, tetraisopropyl bis(dioctyl phosphate) titanate, tetra(2,2-diallyloxymethyl-1-butyl)bis(di-tridecyl) phosphate titanate, bis(dioctyl pyrophosphate)oxyacetate titanate, bis(dioctyl pyrophosphate)ethylene titanate, isopropyl trioctanoyl titanate, and isopropyl tricumyl phenyl titanate.

The coupling agent may be preferably a silane-based coupling agent, more preferably an aminosilane-based coupling agents such as γ-aminopropyl-triethoxy silane, N-β-(aminoethyl)-γ-aminopropyl-triethoxy silane, N-(aminocarbonyl)-γ-aminopropyl triethoxy silane, N-[β-(phenylamino)-ethyl]-γ-aminopropyl triethoxy silane, N-phenyl-γ-aminopropyl triethoxy silane, and N-phenyl-γ-aminopropyl trimethoxy silane. Among them, N-phenyl-γ-aminopropyl trimethoxy silane is particularly preferred.

Examples of the solvent for the solution of a surface treatment agent such as a coupling agent and a chelating agent may include those listed as the organic solvent for the polyimide precursor solution (the solvent contained in the self-supporting film). The preferable organic solvent may be a solvent compatible with the polyimide precursor solution, and may be the same as the organic solvent for the polyimide precursor solution. The organic solvent may be a mixture of two or more compounds.

The content of the surface treatment agent such as a coupling agent and a chelating agent in the surface treatment agent solution (organic solvent solution) may be preferably 0.5 wt % or more, more preferably 1 wt % to 100 wt %, particularly preferably 3 wt % to 60 wt %, further preferably 5 wt % to 55 wt %. The content of water in the surface treatment agent solution may be preferably 20 wt % or less, more preferably 10 wt % or less, particularly preferably 5 wt % or less. A solution of a surface treatment agent in an organic solvent may preferably have a rotational viscosity (solution viscosity measured with a rotation viscometer at a measurement temperature of 25° C.) of 0.8 to 50,000 centipoise.

A particularly preferable solution of a surface treatment agent in an organic solvent may have a low viscosity (specifically, rotational viscosity: 0.8 to 5,000 centipoise) and comprise a surface treatment agent, which is homogeneously dissolved in an amide solvent, in an amount of 0.5 wt % or more, more preferably 1 wt % to 60 wt %, further preferably 3 wt % to 55 wt %.

The application amount of the solution containing the surface treatment agent may be appropriately determined, and may be preferably 1 $g/m^2$ to 50 $g/m^2$, more preferably 2 $g/m^2$ to 30 $g/m^2$, particularly preferably 3 $g/m^2$ to 20 $g/m^2$, for example. The application amount of the surface treatment agent solution to one side may be the same as, or different from the application amount of the surface treatment agent solution to the other side.

The solution containing the surface treatment agent may be applied by any known method; for example, by gravure coating, spin coating, silk screen process, dip coating, spray coating, bar coating, knife coating, roll coating, blade coating, and die coating.

According to the present invention, the self-supporting film on which a surface treatment agent solution is applied, if necessary, is then heated to effect imidization, thereby producing a polyimide film.

The preferable heat treatment may be a process in which polymer imidization and solvent evaporation/removal are gradually conducted at about 100 to 400° C. for about 0.05 to 5 hours, particularly 0.1 to 3 hours as the first step. This heat treatment is particularly preferably conducted stepwise, that is, the first heat treatment at a relatively low temperature of about 100 to 170° C. for about 0.5 to 30 min, then the second heat treatment at a temperature of 170 to 220° C. for about 0.5 to 30 min, and then the third heat treatment at a high temperature of 220 to 400° C. for about 0.5 to 30 min. If necessary, the fourth high-temperature heat treatment at a temperature of 400 to 550° C. may be conducted.

It is preferred that at least both edges of a long solidified film in the direction perpendicular to the length direction, i.e. in the width direction, are fixed with a pin tenter, a clip or a frame, for example, and the solidified film is stretched and/or shrunk in the width direction during heat treatment in a curing oven, as necessary.

According to the present invention, in the case of thermal imidization as described above, the self-supporting film is stretched in the length direction and in the width direction before or during imidizing, if necessary, so that the polyimide film obtained has a coefficient of thermal expansion (25° C. to 500° C.) within a range of from 1 ppm/° C. to 10 ppm/° C. There are no particular restrictions to the stretch ratio. The stretch ratio may be appropriately selected so as to achieve a desired coefficient of thermal expansion. A successive biaxial stretching may be conducted, or alternatively, a simultaneous biaxial stretching may be conducted. The self-supporting film may be uniaxially stretched in the length direction or in the width direction in a case where a desired coefficient of thermal expansion is achieved.

According to the present invention, a polyimide film may be prepared by chemical imidization, or a combination of thermal imidization and chemical imidization. When producing a polyimide film by chemical imidization, a polyimide film having a relatively low coefficient of thermal expansion may be obtained without stretching a self-supporting film.

The chemical imidization may be conducted according to a known method. For example, the polyimide film may be produced as follows. Firstly, a polyamic acid solution, or a polyimide precursor solution is prepared by synthesizing a polyimide precursor in an organic solvent in the same way as in thermal imidization. A dehydrating agent and a catalyst are added to the polyamic acid solution. An inorganic fine particle, and the like may be added to the polyamic acid solution, if necessary, as described in thermal imidization. And then, the solution or solution composition is flow-cast on a suitable support (metal belt, for example) to provide a film, and the film is heated at a temperature equal to or lower than 200° C., preferably at a temperature of from 40° C. to 200° C., using a heat source such as a hot-air blower and an infrared heater, until the film becomes self-supporting, thereby preparing a self-supporting film (hereinafter, also referred to as "gel film"). Subsequently, the gel film thus obtained is heated at a temperature equal to or higher than 300° C., preferably at a temperature of from 300° C. to 500° C., to effect imidization, thereby producing a polyimide film. This heat treatment may be conducted stepwise.

Examples of the dehydrating agent include organic acid anhydrides such as aliphatic acid anhydride, aromatic acid anhydride, alicyclic acid anhydride, heterocyclic acid anhydride, and a mixture thereof. Specific examples of the organic acid anhydride include acetic anhydride, propionic anhydride, butyric anhydride, formic anhydride, succinic anhydride, maleic anhydride, phthalic anhydride, benzoic anhydride, and picolinic anhydride. Among others, acetic anhydride may be suitably used.

Examples of the catalyst include organic tertiary amines such as aliphatic tertiary amine, aromatic tertiary amine, heterocyclic tertiary amine, and a mixture thereof. Specific examples of the organic tertiary amine include trimethylamine, triethylamine, dimethylaniline, pyridine, β-picoline, isoquinoline, and quinoline. Among others, isoquinoline may be suitably used.

The amount of the dehydrating agent to be used is preferably 0.5 mole or more per mole of amic acid bond present in the aromatic polyamic acid contained in the solution. The amount of the catalyst to be used is preferably 0.1 mole or more per mole of amic acid bond present in the aromatic polyamic acid contained in the solution.

In the case of chemical imidization, if necessary, a solution containing a surface treatment agent such as a coupling agent and a chelating agent may be applied to one side or both sides of a self-supporting film before imidizing, as in thermal imidization.

The self-supporting film may be stretched in the same way as in thermal imidization, if necessary, so that the polyimide film obtained has a coefficient of thermal expansion (25° C. to 500° C.) within a range of from 1 ppm/° C. to 10 ppm/° C.

According to the present invention, the polyimide film thus obtained, which preferably has a coefficient of thermal expansion (25° C. to 500° C.) within a range of from 1 ppm/° C. to 10 ppm/° C., may be preferably heated at a temperature equal to or higher than 500° C. in a substantially unstressed state. This heat treatment enables providing a polyimide film having a reduced dimensional change during a high-temperature heat treatment, for example, a heat treatment at a temperature equal to or higher than 500° C., and a reduced shrinkage during a temperature-decreasing step, in particular. In the heat treatment, the polyimide film may be preferably heated at a temperature of from 500° C. to 550° C., more preferably from 500° C. to 540° C., more preferably from 500° C. to 530° C., particularly preferably from 500° C. to 520° C., for 30 sec to 10 min, more preferably for 1 min to 5 min.

The term "in a substantially unstressed state" means that external force (tension) is not applied to a polyimide film, for example, at least one edge of a polyimide film is not fixed, and preferably both edges of a polyimide film are not fixed.

This heat treatment may be conducted immediately after heat treatment for imidization in a successive manner. Alternatively, a polyimide film, which has cooled down after imidizing, may be heated again.

After this heat treatment, the polyimide film may be preferably cooled in a substantially unstressed state.

A polyimide film which have a dimensional change from 25° C. to 500° C. within a range of from −0.3% to +0.6% based on the initial dimension at 25° C.; a weight loss after heat treatment at 500° C. for 20 min within a range of from 0 wt % to 1 wt %; and a coefficient of thermal expansion from 25° C. to 500° C. within a range of from 1 ppm/° C. to 10 ppm/° C. may be produced by the process as described above in which a polyimide film is heated at a temperature equal to or higher than 500° C. in a substantially unstressed state, and preferably a polyimide film is heated at a selected temperature which is equal to or higher than 500° C. for a selected period of time in a substantially unstressed state. When using the polyimide film as a substrate, a CIS solar cell having high conversion efficiency may be obtained.

Although there are no particular restrictions to the thickness of the polyimide film, it may be from about 3 µm to about 250 µm, preferably from about 4 µm to about 150 µm, more preferably from about 5 µm to about 125 µm, particularly preferably from about 5 µm to about 100 µm.

A polyimide film obtained according to the present invention has improved adhesiveness, sputtering properties (suitability for sputtering), and metal vapor deposition properties (suitability for metal vapor deposition). A metal layer (including an alloy layer) may be formed on the polyimide film by a metallizing method such as sputtering and metal vapor deposition, to provide a metal-laminated polyimide film having excellent adherence and sufficiently high peel strength. A metal layer may be laminated on the polyimide film according to a known method.

A polyimide-metal laminate for use in the production of a CIS solar cell comprises a metal layer for use as an electrode, which is formed on or over a polyimide film. The polyimide-metal laminate may comprise, for example, a layer containing molybdenum or tungsten for use as an electrode, which is formed on or over a polyimide film.

The laminate of the present invention may comprise metal layers, which are formed on both sides of the polyimide film. In that case, one of metal layers is to be used as an electrode in a CIS solar cell, and the other is to be used as a protective layer formed on a back surface of a substrate. The two metal layers may be the same, or may be different from each other, and preferably the two layers may be the same.

In the present invention, an electrode layer may be formed on the side (Side B) of a polyimide film which was in contact with a support when producing a self-supporting film thereof. Accordingly, when the laminate of the present invention comprises a single metal layer on one side of the polyimide film, the metal layer, preferably a layer containing molybdenum or tungsten, more preferably a layer containing molybdenum, is formed on the Side B.

A metal layer, preferably a layer containing molybdenum or tungsten, may be formed on the polyimide film by sputtering, vapor deposition, and the like. The conditions for forming the metal layer may be appropriately selected according to a known method.

A thickness of a metal layer, preferably a layer containing molybdenum or tungsten, may be appropriately selected depending on an intended application, and may be preferably from about 50 nm to about 500 nm.

The number of metal layers may be appropriately selected depending on an intended application, and two or more metal layers may be formed.

The CIS solar cell of the present invention will now be described below. The CIS solar cell of the present invention is characterized by comprising a laminate which comprises a metal layer for use as an electrode, which is formed on the Side B of a polyimide film. In one embodiment, the CIS solar cell of the present invention is characterized by comprising a laminate which comprises metal layers formed on both sides of the polyimide film, and using the earlier-formed metal layer as an electrode.

The CIS solar cell of the present invention may be produced according to any known method, for example, a method described in Japanese Laid-open Patent Publication No. 2003-179238. An example of the process for producing the CIS solar cell will now be described with reference to FIGS. 1 to 2.

Figure 1:
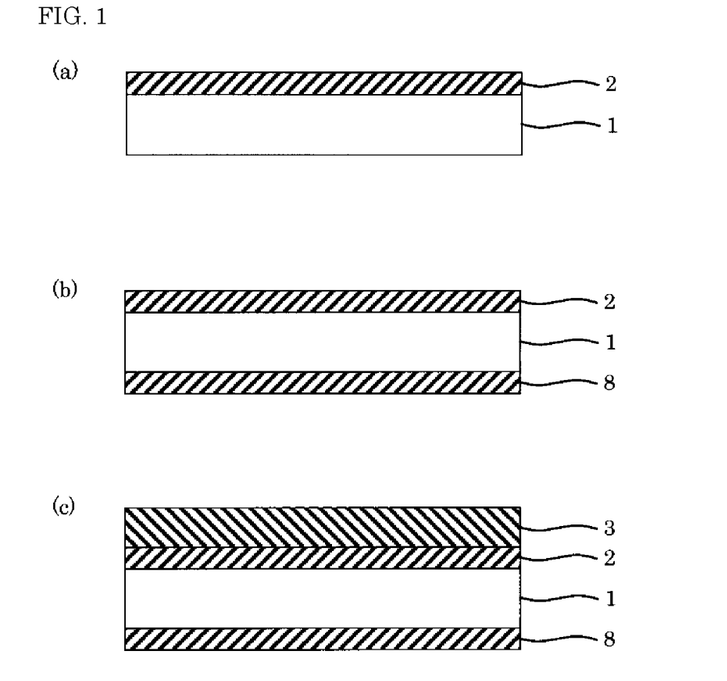
FIG. 1 is a diagram showing a first stage in an example of the process for producing a solar cell of the present invention.

Firstly, an electrode layer 2 is formed on a polyimide film 1 as a substrate, as illustrated in FIG. 1 (a). The electrode layer 2 is a conductive material layer, and generally a metal layer, preferably a Mo layer. The electrode layer 2 may be formed by sputtering or vapor deposition.

According to the present invention, the electrode layer 2 is formed on the side (Side B) of the polyimide film which was in contact with a support when producing a self-supporting film thereof, as described above. A CIS solar cell comprising an electrode layer formed on the Side B may have fewer cracks in an electrode layer and a semiconductor layer, as compared with a CIS solar cell comprising an electrode layer formed on the side (Side A) opposite Side B.

A ground metal layer may be formed between the polyimide film 1 as a substrate and the electrode layer 2, if necessary. The ground metal layer may be formed by a metallizing method such as sputtering and vapor deposition, for example.

Subsequently, as illustrated in FIG. 1 (b), a protective layer 8 is formed on a back surface of the polyimide substrate 1. The protective layer may preferably have a coefficient of thermal expansion from 25° C. to 500° C. within a range of from about 1 ppm/° C. to about 20 ppm/° C., particularly preferably from about 1 ppm/° C. to about 10 ppm/° C. When such a protective layer is formed, cracks in an electrode layer and a semiconductor layer, and curling of a substrate may be further reduced.

The protective layer 8 may be preferably, but not limited to, a layer of the same metal as the electrode layer 2, in view of prevention of curling of a substrate. The protective layer 8 may be formed by sputtering or vapor deposition.

The protective layer 8 is provided when necessary. When a polyimide film having extremely high heat resistance and dimensional stability as described above is used as a substrate, cracks in an electrode layer and a semiconductor layer, and curling of a substrate may be sufficiently reduced without forming a protective layer.

In the present invention, the protective layer 8 may be preferably formed after forming the electrode layer 2, although the electrode layer 2 may be formed after forming the protective layer 8. When the electrode layer 2 is formed before forming the protective layer 8, in other words, when an earlier-formed metal layer (molybdenum layer) is used as an electrode, cracks in an electrode layer and a semiconductor layer may be further reduced.

As described above, the electrode layer may be preferably formed on the Side B. Accordingly, in a process for producing a solar cell of the present invention, it is particularly preferred that an electrode layer is formed on the Side B of a polyimide film, which is a substrate, and then a protective layer is formed on the Side A of the polyimide film. Additionally, in a process for producing a polyimide-metal laminate of the present invention, it is particularly preferred that a metal layer for use as an electrode is formed on the Side B of a polyimide film for use as a substrate, and then a metal layer for use as a protective layer is formed on the Side A of the polyimide film.

Subsequently, as illustrated in FIG. 1 (c), a thin film 3 containing a Group IB element, a Group IIIB element and a Group VIB element is formed on the electrode layer 2. The thin film 3 typically consists of a Group IB element, a Group IIIB element and a Group VIB element. The thin film 3 is converted into a light absorbing layer of a solar cell by heat treatment. The Group IB element in the thin film 3 may be preferably Cu. The Group IIIB element in the thin film 3 may be preferably at least one selected from the group consisting of In and Ga. The Group VIB element in the thin film 3 may be preferably at least one selected from the group consisting of Se and S.

The thin film 3 may be formed by vapor deposition or sputtering. The substrate temperature during the formation of the thin film 3 may be within a range of from room temperature (about 20° C.) to about 400° C., for example, and is lower than the highest temperature in the subsequent heat treatment.

The thin film 3 may be a multi-layer film comprising two or more layers.

A layer containing a Group IA element such as Li, Na and K, and other layers may be formed between the electrode layer 2 and the thin film 3. Examples of the layer containing a Group IA element include a layer of $Na_2S$, a layer of NaF, a layer of $Na_2O_2$, a layer of $Li_2S$ and a layer of LiF. These layers may be formed by vapor deposition or sputtering.

Figure 2:
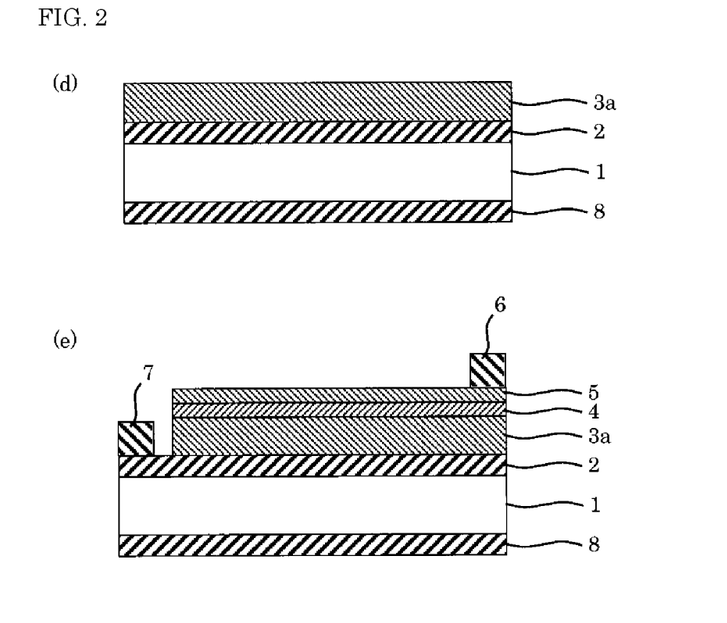
FIG. 2 is a diagram showing a second stage in the example of the process for producing a solar cell of the present invention.

Subsequently, as illustrated in FIG. 2 (d), a semiconductor layer (chalcopyrite semiconductor layer) 3a containing a Group IB element, a Group IIIB element and a Group VIB element is formed by subjecting the thin film 3 to heat treatment. The semiconductor layer 3a functions as a light absorbing layer of a solar cell.

The thin film may be preferably heated in a nitrogen gas atmosphere, in an oxygen gas atmosphere, or in an argon gas atmosphere to convert the thin film into the semiconductor layer. The heat treatment may be also preferably performed in an atmosphere containing at least one selected from the group consisting of Se and S.

It is preferred that the thin film 3 is heated to a temperature of from 500° C. to 550° C., more preferably from 500° C. to 540° C., particularly preferably from 500° C. to 520° C., preferably at a rate of from 10° C./sec to 50° C./sec, and maintained at a temperature within the above-mentioned range preferably for 10 sec to 5 min. And then, the thin film 3 is allowed to cool (cooled naturally), or alternatively, the thin film 3 is cooled more slowly using a heater.

The heat treatment may be performed stepwise. It is preferred, for example, that the thin film 3 is heated to a temperature of from 100° C. to 400° C. and maintained at a temperature within the above-mentioned range preferably for 10 sec to 10 min, and then the thin film 3 is heated to a temperature of from 500° C. to 550° C., more preferably from 500° C. to 540° C., particularly preferably from 500° C. to 520° C., preferably at a rate of from 10° C./sec to 50° C./sec and maintained at a temperature within the above-mentioned range preferably for 10 sec to 5 min. And then, the thin film 3 is allowed to cool (cooled naturally), or alternatively, the thin film 3 is cooled more slowly using a heater.

The semiconductor layer 3a containing a Group IB element, a Group IIIB element and a Group VIB element, which is to be used as a light absorbing layer, is formed as described above. The semiconductor layer 3a thus obtained may be a CuInSe$_2$ semiconductor layer, a Cu(In,Ga)Se$_2$ semiconductor layer, or layers of semiconductors wherein a part of Se is substituted with S in these semiconductors, i.e. a CuIn(S,Se)$_2$ semiconductor layer, or a Cu(In,Ga)(S,Se)$_2$ semiconductor layer, for example.

Alternatively, the semiconductor layer 3a may be formed as follows.

A thin film 3, which contains a Group IB element and a Group IIIB element and contains no Group VIB element, is formed on the electrode layer 2. The thin film 3 typically consists of a Group IB element and a Group 111B element. And then, the thin film is heated in an atmosphere containing at least one Group VIB element, preferably in an atmosphere containing at least one selected from the group consisting of Se and S, to convert the thin film into a semiconductor layer containing a Group IB element, a Group 111B element and a Group VIB element. In that case, the thin film may be formed and heated in the same way as described above.

After forming the semiconductor layer 3a, as illustrated in FIG. 2 (*e*), for example, a window layer (or a buffer layer) 4 and an upper electrode layer 5 are formed on the semiconductor layer 3a, and then extraction electrodes 6, 7 are formed according to a known method, to provide a solar cell. The window layer 4 may be a CdS layer, a ZnO layer or a Zn(O,S) layer, for example. Two or more layers may be formed as the window layer. The upper electrode layer 5 may be a transparent electrode such as ITO and ZnO:Al, for example. An anti-reflective film such as MgF$_2$ may be formed on the upper electrode layer 5.

The configuration of each layer and the process for forming each layer are not limited, and may be appropriately selected.

According to the present invention, a flexible polyimide substrate is used for a CIS solar cell, and therefore a CIS solar cell may be produced in a roll-to-roll process.

EXAMPLES

The present invention will be described in more detail below with reference to the Examples. However, the present invention is not limited to the following Examples.

Physical properties (dimensional change and coefficient of thermal expansion from 25° C. to 500° C., and weight loss after heat treatment at 500° C. for 20 min) of a polyimide film were determined as described above. A thermo-mechanical analyzer TMA/SS6100 made by SII Technology Inc. was used to determine dimensional change and coefficient of thermal expansion from 25° C. to 500° C. of a polyimide film.

The occurrence of cracks in a molybdenum-laminated polyimide film was evaluated as follows.

A laminate in which a molybdenum layer was formed on one side or both sides of a polyimide film was heated at 500° C. for 2.5 min, and then cooled to room temperature. The surface of the molybdenum layer was observed with an optical microscope to evaluate the presence or absence of cracks.

Example 1

Preparation of Polyamic Acid Solution

Into a polymerization tank were placed 2,470 parts by weight of N,N-dimethylacetamide, 294.33 parts by weight of 3,3',4,4'-biphenyltetracarboxylic dianhydride (s-BPDA) and 108.14 parts by weight of p-phenylenediamine (PPD). And then, the resulting mixture was reacted at 30° C. for 10 hours, to give a polyamic acid solution (polyimide precursor solution). The polyamic acid solution thus obtained had a polymer logarithmic viscosity (measurement temperature: 30° C.; concentration: 0.5 g/100 mL (solvent); solvent: N,N-dimethylacetamide) of 2.66 and a rotational viscosity at 30° C. of 3,100 poise.

(Preparation of Polyimide Film)

To the polyamic acid solution thus obtained were added 0.55 mole of acetic anhydride and 0.55 mole of isoquinoline per mole of repeating unit in the polyamic acid, and the resulting mixture was fully stirred, to provide a dope at about 0° C. for film formation.

The dope thus obtained was continuously flow-cast from a T-die on a smooth metallic endless belt and dried under hot air while rotating the belt. As for the temperature conditions within the belt chamber, the dope was dried at a belt temperature of 120° C. for 2 min and the temperature of the cooling pulley was 85° C. After drying, the gel film thus obtained was peeled off from the endless belt. The gel film had a volatile content of 31%.

Subsequently, the gel film was heated at 200° C. for 30 sec, and then gradually heated to a temperature of from 350° C. to 500° C. for 120 sec in total in a tenter chamber to effect imidization. Then, the film was gradually cooled to room temperature, to provide a polyimide film having an average thickness of 35 µm. And then, the polyimide film thus obtained was heated at 500° C. for 2.5 min in a state in which the film was substantially unstressed (in a substantially unstressed state).

The dimensional change from 25° C. to 500° C., the coefficient of thermal expansion from 25° C. to 500° C., and the weight loss after heat treatment at 500° C. for 20 min of the polyimide film thus obtained were determined. The maximum value and the minimum value of the dimensional change from 25° C. to 500° C. were 0.55%/0.45% (MD/TD) and 0.05%/0.15% (MD/TD), respectively. The coefficient of thermal expansion from 25° C. to 500° C. was 7 ppm/° C. The weight loss after heat treatment at 500° C. for 20 min was 0.351%.

(Preparation of Molybdenum-Laminated Polyimide Film)

The polyimide film thus prepared was pre-treated by RF sputtering (power: 2.0 kW/m$^2$). Subsequently, a Mo layer with a thickness of 100 nm was formed on the Side B of the polyimide film, and then a Mo layer with a thickness of 100 nm was formed on the Side A of the polyimide film, to provide a molybdenum-laminated polyimide film. The Mo layers were formed by DC sputtering on both sides of the polyimide film under the following conditions.

(Mo Sputtering Conditions)
Power: 40 kW/m$^2$ (DC),
Sputtering gas: Ar,
Chamber pressure: 0.6 Pa,
Polyimide film width: 300 mm,
Feed speed: 0.3 m/min.

The molybdenum-laminated polyimide film thus obtained was evaluated for the presence or absence of cracks. After the laminate was heated at 500° C. for 2.5 min, no cracks were observed in the molybdenum layer which is earlier formed on the Side B, while cracks were partly observed in the molybdenum layer which is formed on the Side A.

Example 2

A molybdenum-laminated polyimide film was produced in the same way as in Example 1, except that a Mo layer with a thickness of 100 nm was formed only on the Side B of the polyimide film.

The molybdenum-laminated polyimide film thus obtained was evaluated for the presence or absence of cracks. After the laminate was heated at 500° C. for 2.5 min, no cracks were observed in the molybdenum layer which is formed on the Side B.

Example 3

Comparative Example

A molybdenum-laminated polyimide film was produced in the same way as in Example 1, except that a Mo layer with a thickness of 100 nm was formed only on the Side A of the polyimide film.

The molybdenum-laminated polyimide film thus obtained was evaluated for the presence or absence of cracks. After the laminate was heated at 500° C. for 2.5 min, cracks were partly observed in the molybdenum layer which is formed on the Side A.

Example 4

Reference Example

A molybdenum-laminated polyimide film was produced in the same way as in Example 1, except that a Mo layer was formed on the Side A of the polyimide film, and then a Mo layer was formed on the Side B of the polyimide film.

The molybdenum-laminated polyimide film thus obtained was evaluated for the presence or absence of cracks. After the laminate was heated at 500° C. for 2.5 min, cracks were partly observed in the molybdenum layer which is formed on the Side B after forming the molybdenum layer on the Side A.

Example 5

Reference Example

The molybdenum-laminated polyimide film obtained in Example 1 was heated at 350° C. for 2.5 min, and then evaluated for the presence or absence of cracks. No cracks were observed in the molybdenum layer formed on the Side B and in the molybdenum layer formed on the Side A.

INDUSTRIAL APPLICABILITY

As described above, according to the present invention, a CIS solar cell having flexibility and high conversion efficiency may be produced, using a polyimide-metal laminate in which fewer cracks occur in a metal layer after heat treatment at a temperature equal to or higher than 500° C.

REFERENCE SIGNS LIST

1: polyimide substrate
2: electrode layer
3: thin film
3a: semiconductor layer
4: window layer
5: upper electrode layer
6, 7: extraction electrode
8: protective layer

The invention claimed is:

1. A process for producing a CIS solar cell comprising:
    producing a polyimide film by imidizing a self-supporting film, which is prepared by flow-casting a solution of a polyimide precursor prepared from 3,3',4,4'-biphenyltetracarboxylic dianhydride (s-BPDA) and p-phenylenediamine (PPD) on a support, followed by heating;
    forming a metal layer comprising molybdenum with a thickness of about 50 nm to about 500 nm for use as an electrode only on the side (Side B) of the polyimide film which was in contact with the support when producing the self-supporting film, to provide a polyimide-metal laminate; and
    forming a chalcopyrite semiconductor layer on the metal layer on Side B of the polyimide film in the laminate.

2. The process according to claim 1, wherein the 3,3',4,4'-biphenyltetracarboxylic dianhydride is in an amount of at least 75 mol %, and p-phenylenediamine is in an amount of at least 75 mol %.

3. The process according to claim 1, wherein the metal layer for use as an electrode is formed by sputtering or vapor deposition.

4. The process according to claim 1, wherein the process to form the chalcopyrite semiconductor layer comprises heat treatment at a temperature greater than or equal to 500° C.

5. A process for producing a CIS solar cell comprising:
    producing a polyimide film by imidizing a self-supporting film, which is prepared by flow-casting a solution of a polyimide precursor prepared from 3,3',4,4'-biphenyltetracarboxylic dianhydride (s-BPDA) and p-phenylenediamine (PPD) on a support, followed by heating;
    forming a metal layer consisting of molybdenum with a thickness of about 50 nm to about 500 nm for use as an electrode on the side (Side B) of the polyimide film which was in contact with the support when producing the self-supporting film, to provide a polyimide-metal laminate;
    forming a chalcopyrite semiconductor layer on the metal layer on Side B of the polyimide film in the laminate; and
    forming a metal layer for use as a protective layer on the opposite side (Side A) of the polyimide film in the laminate to Side B.

6. The process according to claim 5, wherein the metal layer for use as a protective layer is formed by sputtering or vapor deposition.

7. The process according to claim 5, wherein the process to form the chalcopyrite semiconductor layer comprises heat treatment at a temperature greater than or equal to 500° C.

* * * * *